United States Patent
Yamada

(12) 
(10) Patent No.: US 6,621,742 B1
(45) Date of Patent: Sep. 16, 2003

(54) SYSTEM FOR PROGRAMMING A FLASH MEMORY DEVICE

(75) Inventor: Shigekazu Yamada, Cupertino, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/136,033

(22) Filed: Apr. 29, 2002

(51) Int. Cl.[7] .............................................. G11C 16/06

(52) U.S. Cl. ............................ 365/185.22; 365/185.24; 365/185.19

(58) Field of Search ...................... 365/185.22, 185.19, 365/185.24, 185.14, 185.15, 185.03

(56) References Cited

U.S. PATENT DOCUMENTS 5,892,714 A * 4/1999 Choi ..................... 365/185.22

* cited by examiner

*Primary Examiner*—David Lam
(74) *Attorney, Agent, or Firm*—Sheppard Mullin Richter & Hampton LLP

(57) ABSTRACT

System to program core cells in a memory device without over-programming. The system includes a method for programming a voltage threshold (Vt) level of a core cell in a memory device. The method comprises steps of determining a desired Vt for the core cell, programming a portion of the Vt of the core cell using a selected programming strength, verifying that the portion of the Vt is successfully programmed, adjusting the selected programming strength, and repeating the step of programming, verifying, and adjusting until the Vt of the core cell is substantially equal to the desired Vt.

6 Claims, 2 Drawing Sheets

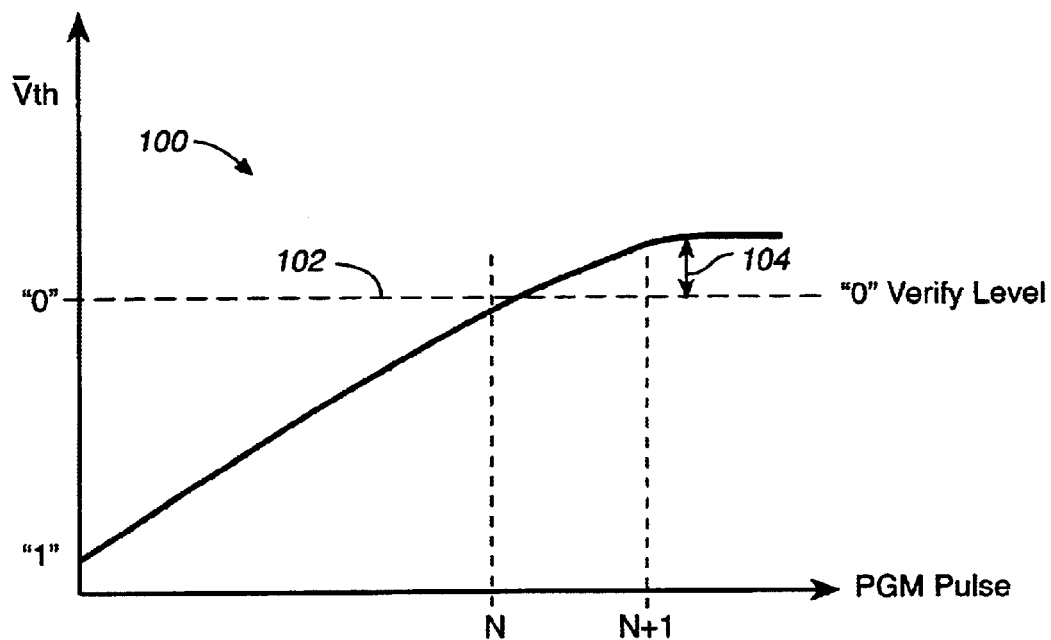
FIG._1
*(PRIOR ART)*
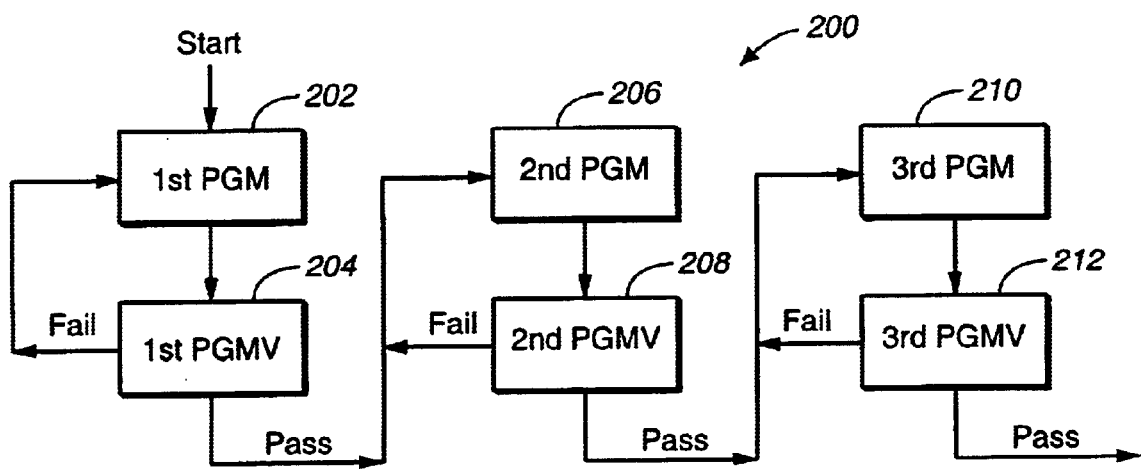
FIG._2

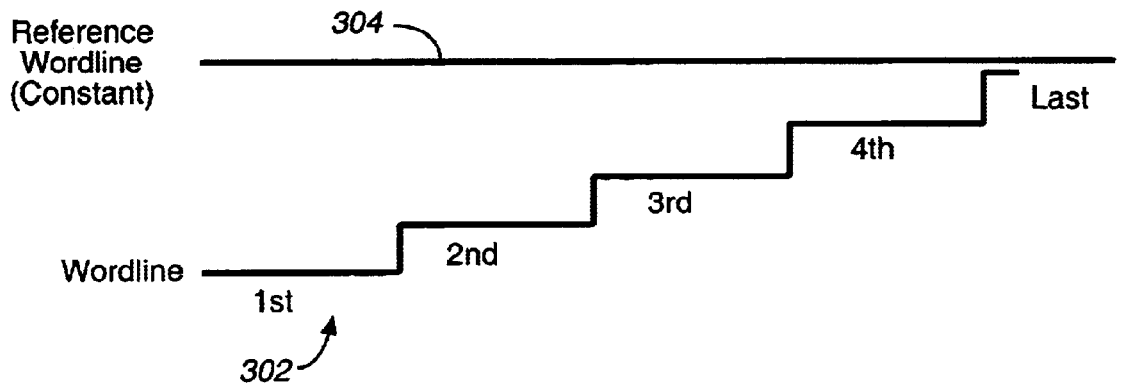
FIG._3
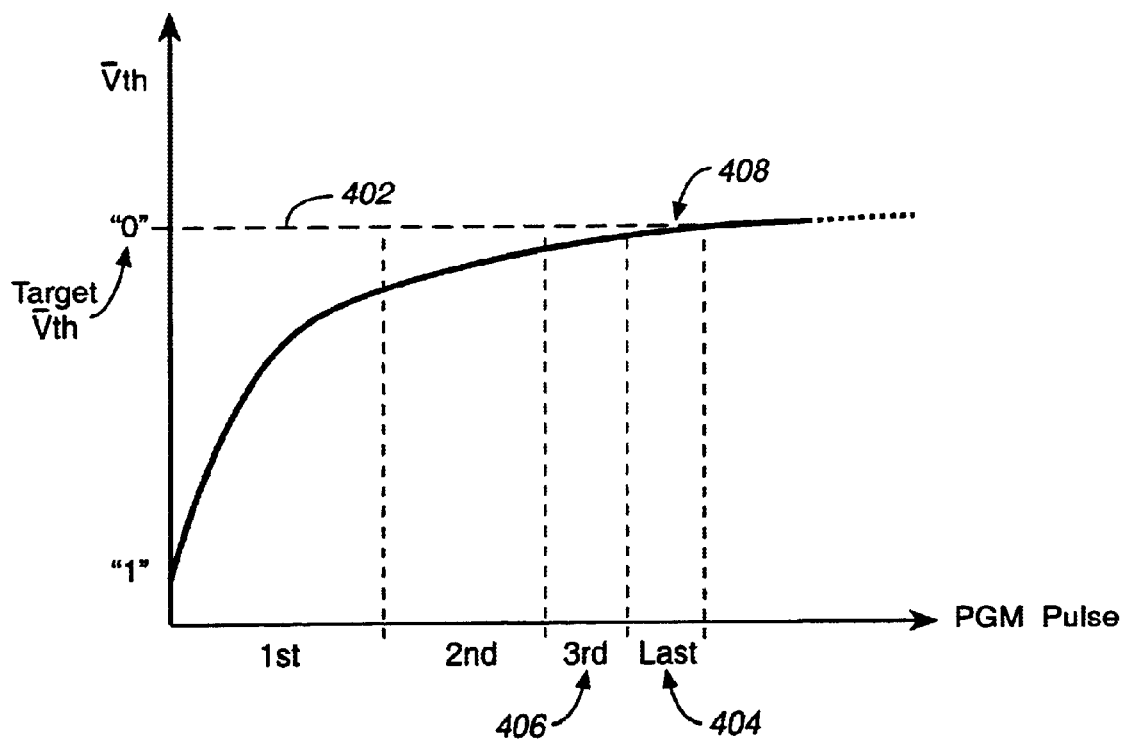
FIG._4

SYSTEM FOR PROGRAMMING A FLASH MEMORY DEVICE

FIELD OF THE INVENTION

The present invention relates to semiconductor memory devices, and more particularly, to a system for programming core cells in a memory device.

BACKGROUND OF THE INVENTION

Semiconductor devices, such as memory devices, are commonly used as information storage devices in digital systems. As the amount of information that needs to be stored increases, it has become increasingly important to have an efficient way of accessing such memory devices.

Generally, memory read or write operations are initiated in response to external signals provided to the memory by a controller, such as a processor. In most cases, the amount of information that needs to be transferred during a memory access is large. In addition, the rate at which the information is propagated from a processor to a memory device and vice versa continues to increase. Therefore, increasing performance demands are being placed on the ability to read and write information to memory devices.

In a Flash memory, there are many requirements for programming, erasing and otherwise operating the memory cells. As the technology has progressed, a new requirement has emerged. This new requirement is to prevent the over programming of the memory cells. As a result, when over-programming is avoided, it is possible to get a tight voltage threshold (Vth) distribution.

Conventional methods for programming core cells of a Flash memory device use constant-programming and verification conditions. Using this technique, however, makes over-programming highly likely. This is true because when the core cell is almost programmed to the desired Vth level, the next programming pulse is applied, which then over-programs the core cell.

FIG. 1 shows a graph 100 illustrating how conventional methods result in over-programming of core cells in a Flash memory device. At programming (PGM) pulse N the core cell is almost programmed to have a Vth level representative of a data bit "0", indicated at 102. Another programming pulse (N+1) is provided to reach the "0" verify level. Unfortunately, this program pulse results in an over-programmed condition as shown at 104.

Therefore, it would be desirable to have a way to program core cells in a memory device without over-programming.

SUMMARY OF THE INVENTION

The present invention includes a system to program core cells in a memory device without resulting in an over-programmed condition. As a result of the operation of the invention, it is possible to obtain a very tight Vth distribution for core memory cells without over-programming them.

In one embodiment of the present invention, a method is provided for programming a voltage threshold (Vt) level of a core cell in a memory device. The method comprises steps of determining a desired Vt for the core cell, programming a portion of the Vt of the core cell using a selected programming strength, verifying that the portion of the Vt is successfully programmed, adjusting the selected programming strength, and repeating the step of programming, verifying, and adjusting until the Vt of the core cell is substantially equal to the desired Vt.

BRIEF DESCRIPTION OF THE DRAWINGS

The foregoing aspects and the attendant advantages of this invention will become more readily apparent by reference to the following detailed description when taken in conjunction with the accompanying drawings wherein:

FIG. 1 shows a graph illustrating how conventional methods result in over-programming of core cells in a Flash memory device;

FIG. 2 shows a method for programming core cells of a memory device in accordance with the present invention;

FIG. 3 shows increasing word line voltage associated with various programming stages in accordance with the present invention; and FIG. 4 shows a graph illustrating how the Vth of a core cell increases with each programming stage in accordance with the present invention.

DETAILED DESCRIPTION OF THE INVENTION

The present invention includes a system to program core cells in a memory device without resulting in an over-programmed condition. Thus, various embodiments of the system included in the present invention are discussed in detail in the following text.

Exemplary Embodiment

In one embodiment of the invention, the Vth levels of core memory cells are programmed without being over-programmed. In this embodiment, the programming conditions are changed depending on the current programmed level of a particular core cell. As a result, over-programming that occurs in conventional systems is avoided. Programming of the memory cells can be done using conventional programming logic, operated in accordance with the present invention.

FIG. 2 shows a method 200 for programming core cells of a memory device in accordance with the present invention. In order to know how far a core cell is programmed, the program verify (PGMV) conditions can be changed was well. By adjusting the program (PGM) and program verify (PGMV) conditions it is possible to set any desired number of programming stages. Thus, when a selected programming stage is passed, the method proceeds to the next programming stage, which may have weaker programming conditions. This process is repeated and the last stage programming is verified, at which point, the core cell is successfully programmed without over-programming.

In one embodiment, each successive programming stage uses the same or weaker programming conditions as the previous stage. Thus, it is possible to use strong programming conditions initially to quickly program the core cell to a desired level. After this is done, weaker programming conditions are used to exactly program the core cell to the selected level without over-programming.

Referring now to FIG. 2, the method begins at a first programming stage 202 that is used to program a selected core cell to a first desired level. After the first programming, the method proceeds to a first verify stage 204 that verifies whether the first stage programming was successful, i.e., whether programming the core cell to the first desired level was achieved. If this first verify stage fails, the method proceeds back to the first programming stage 202 where the core cell is programmed again. If the first verify stage 204 is passed, then the method proceeds to the second programming stage 206.

At the second programming stage 206, the core cell is programmed to a second desired level. After the second programming stage 206 the method proceeds to the second verify stage 208. If the second desired level is achieved, the method continues to the third programming stage 210 and third verify stage 212, and so on until the core cells are successfully programmed without be over-programmed.

As the method continues, the programming and corresponding verifying conditions are changed in accordance with the present invention to avoid over-programming the core cell. For example, in one embodiment, the strength of the programming pulse at each successive programming stage is made weaker. Factors that determine the programming strength include, but are not limited to, gate voltage, drain voltage, pulse length and other parameters. At each successive stage, these programming factors are adjusted to weaken the programming strength. For example, the programming pulse duration may be shortened and/or the programming pulse amplitude may be reduced.

In accordance with the present invention, any adjustment to the programming pulses may be made to eliminate over-programming of core cells. For example, in one embodiment, the programming pulses are successively weakened until the last programming pulse (which is the weakest) is used to program a core cell to a desired level. In another embodiment, the programming pulse strength is maintained for the first few programming stages, until the core cell threshold level approaches the desired level. Then the programming strength used for succeeding programming stages is weakened so that the core cell can be programmed substantially to the desired level.

With regards to the program verify stages, at each stage the core cell word line voltage gets higher in order to detect a certain core cell Vth. In this way it is possible to know how far the core cell has been programmed in order to determine whether the corresponding programming stage has been successful.

FIG. 3 shows increasing word line voltage associated with various programming stages in accordance with the present invention. In the first stage verify 302, it can be easily seen that the word line voltage is less than a reference 304 word line voltage. In succeeding stages, as each programming is completed, the word line voltage increases to the level of the reference word line voltage.

The following is an example of programming in accordance with the present invention. Assuming Vt(ref)=5 v and Vg(ref)=6 volts and these are fixed values. During each verify operation, the sense amplifier indicates a verified condition when core cell current is equal to reference current, (i.e., I=I(ref)). If it is desired to have the core cell Vt =3 v, then Vg of the core cell can be set to be 4 v according to the following equations.

$$I=a(Vg-Vt)$$

$$I(ref)=a(Vg(ref)-Vt(ref))$$

Therefore, in the early programming stages where you want low core cell Vt, the wordline voltage for the core cell should be lower than that for the reference cell. As the core cell Vt approaches the reference cell Vt after each verify stage, the wordline voltage for the core cell should approach reference cell wordline.

FIG. 4 shows a graph illustrating how the Vth of a core cell increases with each programming stage in accordance with the present invention. A targeted Vth for a data bit "0" is shown at 402. As each programming pulse occurs, the Vth increases accordingly. In accordance with the present invention, succeeding programming pulses are made weaker so that the Vth of the core cell approaches the targeted Vth without over-programming. For example, the last programming pulse 404 is weaker than the $3^{rd}$ programming pulse 406. As a result, the last programming pulse causes the Vth to increase;to the level of the targeted Vth 402 as shown at 408. Thus, the Vth is increased very gently around the target Vth. This leads to no over-programming and a tight Vth distribution among core cells.

In another embodiment included in the present invention, strong programming conditions are used in the early stages of programming and result in faster programming of the core cell Vt. Thus, it is possible to maintain efficient programming time for the device, while the last programming stages are very gentle to assure a tight Vt distribution.

The present invention includes a system for setting voltage threshold levels of core cells of a memory device. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention, which is set forth in the following claims.

What is claimed is:

1. A method for programming a voltage threshold (Vt) level of a core cell in a memory device, the method comprising steps of:

determining a desired Vt for the core cell;

programming a portion of the Vt of the core cell using a selected programming strength;

verifying that the portion of the Vt is successfully programmed;

adjusting the selected programming strength; and repeating the step of programming, verifying, and adjusting until the Vt of the core cell is substantially equal to the desired Vt.

2. The method of claim 1, further comprising, after the step of verifying, a step of returning to the step of programming using the selected programming strength if it is determined that the portion of the Vt was unsuccessfully programmed.

3. The method of claim 2, wherein the step of adjusting is a step of weakening the selected programming strength.

4. The method of claim 2, wherein the step of adjusting is a step of weakening the selected programming strength as the Vt of the core cell approaches the desired Vt.

5. The method of claim 2, wherein the step of adjusting is a step of weakening the selected programming strength after each successful steep of verifying.

6. The method of claim 2, wherein the step of adjusting comprises steps of:

using the same selected programming strength for a first selected number of programming steps; and weakening the programming strength for a second selected number of programming steps.

* * * * *

Adverse Decision in Interference

Patent No. 6,621,742, Shigekazu Yamada, SYSTEM FOR PROGRAMMING A FLASH MEMORY DEVICE, Interference No. 105,386, final judgment adverse to the patentees rendered, February 22, 2006, as to claims 1-6.

*(Official Gazette April 18, 2006)*